United States Patent
Tanaka et al.

(10) Patent No.: US 8,941,440 B2
(45) Date of Patent: Jan. 27, 2015

(54) DIFFERENTIAL CIRCUIT COMPENSATING GAIN ENHANCEMENT DUE TO SELF HEATING OF TRANSISTORS

(71) Applicant: Sumitomo Electric Industries, Ltd., Osaka (JP)

(72) Inventors: Keiji Tanaka, Chigasaki (JP); Akihiro Moto, Yokohama (JP); Yoshiyuki Sugimoto, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 33 days.

(21) Appl. No.: 13/778,320

(22) Filed: Feb. 27, 2013

(65) Prior Publication Data
US 2013/0229231 A1    Sep. 5, 2013

(30) Foreign Application Priority Data

Mar. 2, 2012 (JP) ................... 2012-046999

(51) Int. Cl.
*H03F 3/45* (2006.01)
*H03F 3/08* (2006.01)

(52) U.S. Cl.
CPC ............ *H03F 3/4508* (2013.01); *H03F 3/087* (2013.01); *H03F 3/45085* (2013.01); *H03F 3/45475* (2013.01); *H03F 3/45556* (2013.01); *H03F 2200/447* (2013.01); *H03F 2203/45008* (2013.01); *H03F 2203/45078* (2013.01)
USPC ........................................... 330/254; 330/261

(58) Field of Classification Search
USPC ....................... 330/254, 261, 295, 124 R, 69
See application file for complete search history.

(56) References Cited

U.S. PATENT DOCUMENTS

| 4,818,951 | A | * | 4/1989 | Roberts | 330/254 |
| 4,868,517 | A | * | 9/1989 | Waldhauer et al. | 330/254 |
| 5,327,098 | A | * | 7/1994 | Molina et al. | 330/254 |

FOREIGN PATENT DOCUMENTS

| JP | 7-240640 A | 9/1995 |
| JP | 2000-349571 A | 12/2000 |
| JP | 2010-136169 A | 6/2010 |

* cited by examiner

*Primary Examiner* — Henry Choe
(74) *Attorney, Agent, or Firm* — Smith, Gambrell & Russell, LLP

(57) ABSTRACT

A differential circuit with a function to compensate the gain enhancement due to the self-heating of the transistor is disclosed. The differential circuit includes an equalizer unit coupled with one of paired transistors. The other of the paired transistor receives the input signal to be amplified. The base level, or the base-emitter bias, is oppositely modulated by the input signal through the common emitter, which causes the modification of the base current. The equalizer unit reduces the variation of the base level only in low frequencies where the self-heating effect of the transistor appears.

17 Claims, 8 Drawing Sheets

DIFFERENTIAL CIRCUIT COMPENSATING GAIN ENHANCEMENT DUE TO SELF HEATING OF TRANSISTORS

BACKGROUND OF THE INVENTION

1. Field of the Invention

Embodiments of the present application relate to a differential circuit, in particular, the embodiments relate to a differential circuit usable in an optical receiver.

2. Related Background Arts

An optical receiver generally implements with a differential circuit in the front end thereof. It has been sometimes raised as a subject to be solved that, a differential circuit and a trans-impedance amplifier (hereafter denoted as "TIA") widely used in the optical receiver often shows a gain peaking or a gain enhancement by about a few decibel (dB) in low frequencies less than 100 kHz, which is less than the cut-off frequency of the TIA. This is due to the self-heating effect of a bipolar transistor type of, what is called, the hetero-junction bipolar transistor (HBT). Such a gain enhancement or gain peak causes less quality of signals to be transmitted or received. The present invention provides solutions for compensating this gain enhancement or the gain peak.

SUMMARY OF THE INVENTION

An aspect of the present application relates to a differential circuit that receives input signals complementary to each other. The differential circuit according to an embodiment of the invention includes first and second differential units, and first and second filters. Each of the differential units includes a pair of transistors. One of paired transistors in the first differential unit receives one of input signals, and one of paired transistors in the second differential unit receives another of the input signals.

At least another of paired transistors in the first differential unit and that of the second differential unit show a gain enhancement in frequencies below the transition frequency caused by the self-heating effect of the transistors. A feature of the differential circuit according to the embodiment is that another of the paired transistors in the first differential unit and that of the second differential unit receive an average of the input signals through the first filter and the second filter. That is, the first filter generates the first compensating signal provided to another of the paired transistor of the first differential unit, while, the second filter generates the second compensating signal provided to another of the paired transistor in the second differential unit; and these first and second compensating signals are in phase to the one of the input signals and the other of the input signals, respectively, which reduces the differential gain of the first and second differential units.

BRIEF DESCRIPTION OF DRAWINGS

The foregoing and other purposes, aspects and advantages will be better understood from the following detailed description of a preferred embodiment of the invention with reference to the drawings, in which.

DESCRIPTION OF PREFERRED EMBODIMENTS

Next, some preferred embodiments according to the present invention will be described as referring to drawings. In the description of the drawings, numerals or symbols same or similar to each other will refer to elements same or similar to each other without overlapping explanations.

First Embodiment

Figure 1:
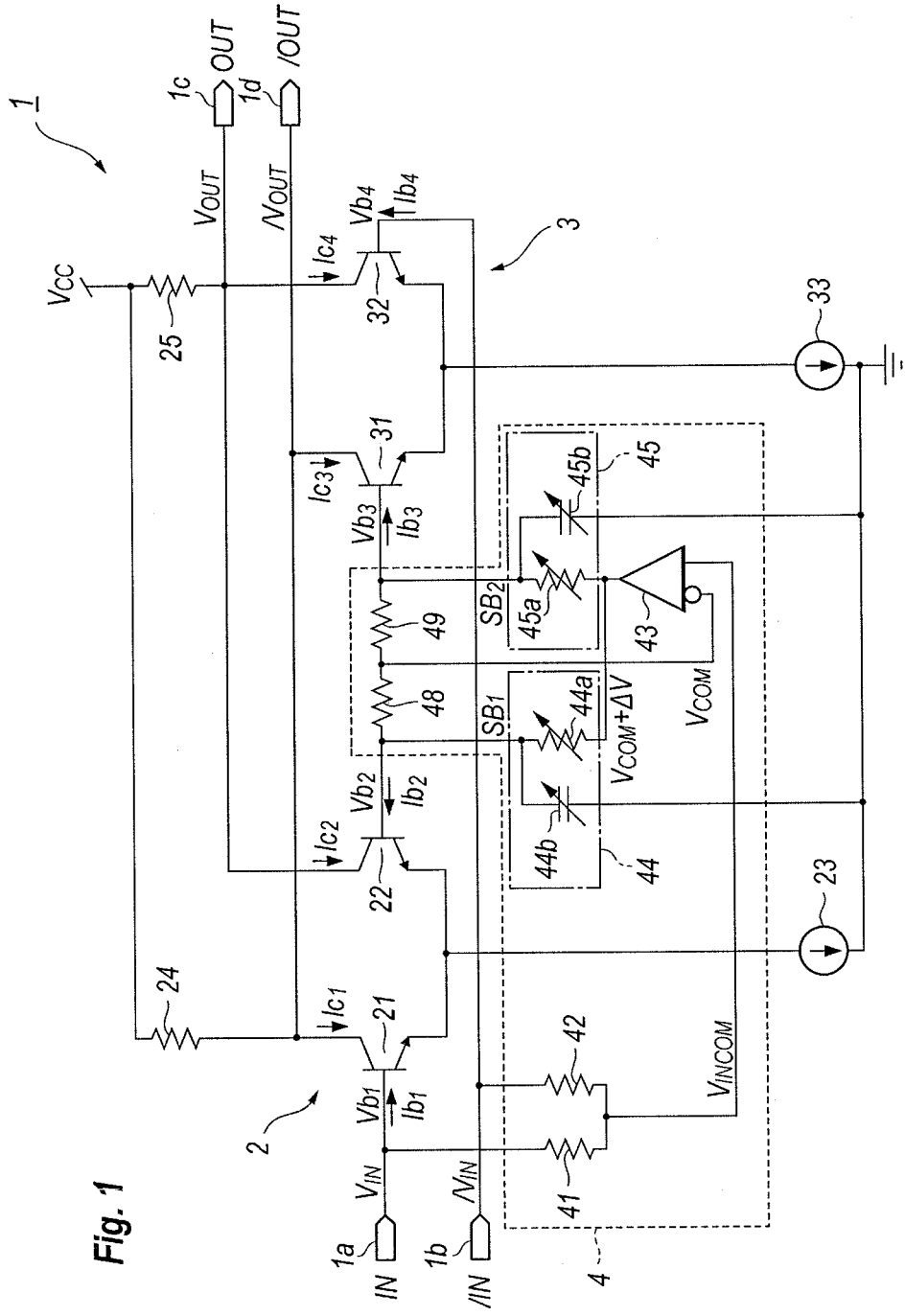
FIG. 1 is a circuit diagram of a differential circuit according to an embodiment of the present invention.

FIG. 1 is a circuit diagram of a differential circuit according to an embodiment of the present invention. As shown in FIG. 1, the differential circuit 1 includes a first differential unit 2, a second differential unit 3, and an equalizer unit 4 as circuit blocks; and two input terminals, 1a and 1b, and two output terminals, 1c and 1d. The differential circuit 1 is usable to an optical receiver used in an optical communication system, in particular, a front end circuit of an optical receiver.

Two input terminals, 1a and 1b, receive signals, IN and /IN, complementary to each other. A symbol slash "/" means in the present specification that the signal named subsequent to the slash has a phase opposite to a signal without the slash. For instance, the signal /IN has a phase opposite to the signal IN and a magnitude thereof is substantially equal to the magnitude of the signal IN. The differential circuit 1 amplifies the signals, IN and /IN, and outputs amplified signals, OUT and /OUT, from the output terminals, 1c and 1d.

The first differential unit 2 receives the one of input signals IN and outputs the output signals, $V_{OUT}$ and $/V_{OUT}$. The first differential unit 2 includes a pair of loads, 24 and 25, a pair of transistors, 21 and 22, and a constant current source 23, where they are connected in series between the power supply $V_{CC}$ and the ground. The paired transistors, 21 and 22, are the type of npn bipolar transistor having the base connected to the input terminal 1a to receive one of input signals $V_{IN}$ and another base connected to the equalizer unit 4 to receive one of biases SB1; collectors connected to respective loads, 24 and 25, and emitters commonly connected to the constant current source 23.

The constant current source 23 operates to keep a sum of currents each flowing in the transistor 21 and the other transistor 22. Thus, the emitters of the paired transistors, 21 and 22, are grounded through the constant current source 23.

The first load 24 is put between the collector of one of the paired transistors 21 and the power supply $V_{CC}$; while, the other load 25 is put between the collector of the other of paired transistors 22 and the power supply $V_{CC}$. The loads, 24 and 25, have resistance of about 100Ω.

The second differential unit 3, which receives the second input signal $/V_{IN}$ and outputs the signals, $V_{OUT}$ and $/V_{OUT}$, includes a second pair of transistors, 31 and 32, and a current source 33 accompanied with the loads, 24 and 25, where they are connected in series between the power supply $V_{CC}$ and the ground. The second pair of transistors, 31 and 32, is the type of the npn bipolar transistor with bases connected to the input terminal 1b to receive the second input signal /$V_{IN}$ and another base connected to the equalizer unit 5 to receive a bias SB2, collectors connected respective loads, 24 and 25, and emitters commonly connected to the current source 33.

The first load 24 is put between the power supply $V_{CC}$ and the transistor 31 whose base receives the second bias SB2; while the second load 25 is put between the power supply $V_{CC}$ and the collector of the transistor 32 whose base receives the second input signal /$V_{IN}$. This arrangement is different from those of the first differential unit 2. In the first differential unit 2, the first load 24 is coupled with the transistor 21 that receives the first input signal $V_{IN}$, while, the other load 25 is coupled with the other transistor 22 that receives the bias SB1 from the equalizer unit 5. The second current source 33 operates as that of the first current source 23 to keep the sum of the currents each flowing in the transistor 31 and the other transistor 32.

Figure 2:
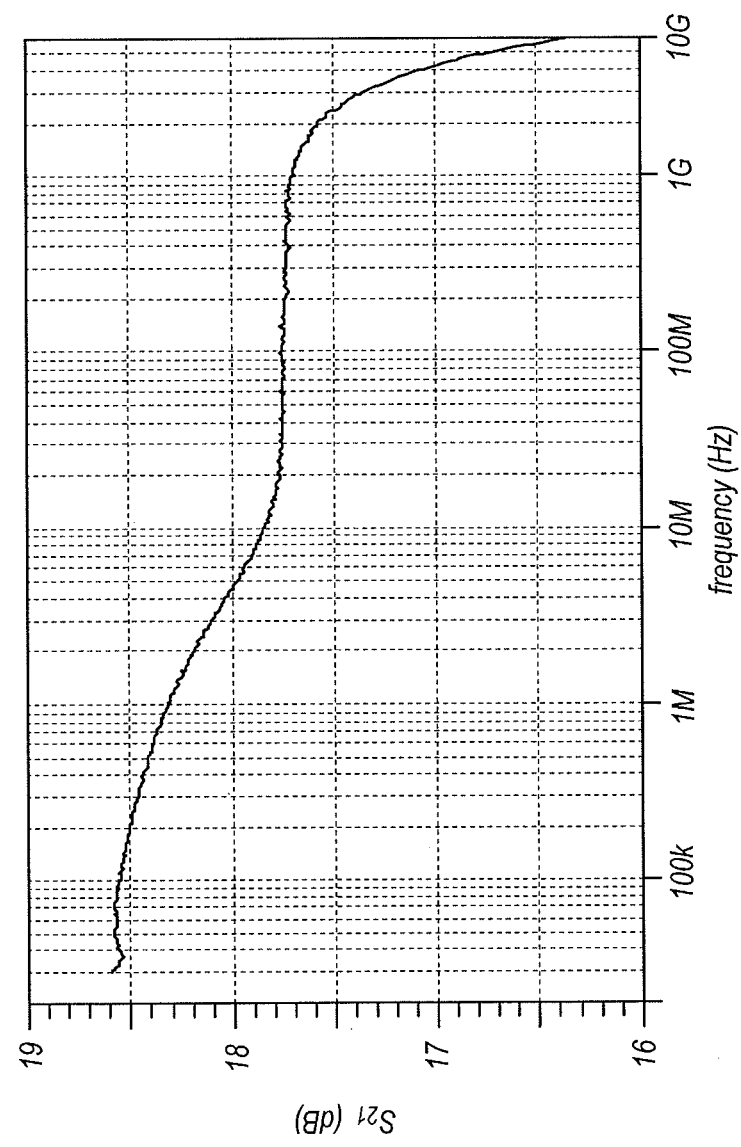
FIG. 2 shows a frequency response of a typical HBT implemented within the differential circuit of FIG. 1.

Next, a frequency response of a bipolar transistor, in particular, the bipolar transistor of the type of, what is called, the hetero-bipolar transistor (hereafter denoted as HBT), will be described. FIG. 2 shows a frequency response of one of s-parameters $S_{21}$ of an HBT, which corresponds to the gain of the transistor. As shown in FIG. 2, an HBT shows a flat response in a region from 20 MHz to 1 GHz. However, an HBT generally shows a distinguishable feature in the frequency response thereof that in lower frequencies, the gain S21 increases as the frequency decreases. In other words, an HBT shows a higher and non-flat gain in lower frequencies whose level is higher than a flat gain in high Frequencies. In the description presented below, a frequency, from which the gain of an HBT increases in lower frequencies, is defined as the transition frequency.

Figure 3:
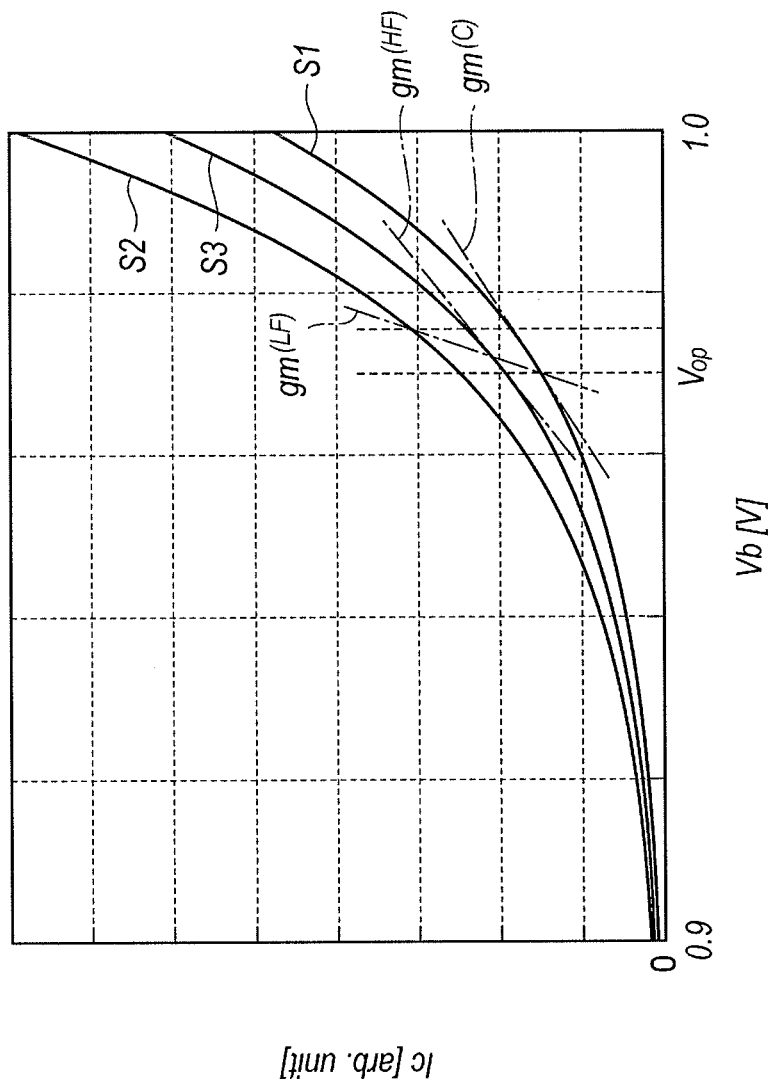
FIG. 3 compares the Vb-Ic characteristic of an HBT at various temperatures.

FIG. 3 schematically shows transfer curves, which is often called as Vb-Ic characteristic, of an HBT under various temperatures. The trans-conductance gm of an HBT, which is given by a slope of the transfer curves; generally increase as the temperature thereof increases because carries in semiconductor regions increase depending on the temperature. In FIG. 3, a behavior S1 is the Vb-Ic curve at a temperature T; while, a behavior S2 corresponds to that at a temperature of T+ΔT; and a behavior S3 is midpoints of the behavior S1 and the behavior S2. Ignoring the self-heating of the transistor, the device temperature of the HBT is kept constant in T. Driving the HBT at temperature T with a bias $V_{OP}$, the Vb-Ic curve is given by a behavior S1, and the trans-conductance $gm^{(C)}$ (=dIc/dVb) is given by a tangent at the operating point.

Taking the self-heating of the semiconductor active region into account, the current flowing in the HBT increases as the signal input therein increases from the operating point $V_{OP}$, which increases the device temperature by ΔT and the Vb-Ic curve turns to the behavior S2. In such a situation, the trans-conductance at lower frequency $gm^{(LF)}$ is given by a line connecting a point at the bias $V_{OP}$ on the behavior S1 to another point at a bias $V_{OP}+V_{SIG}$ on the behavior S2. Increasing the signal frequency, the up and down of the temperature cannot follow the variation of the signal and the Vb-Ic curve of the HBT becomes the behavior S3 and the trans-conductance $gm^{(HF)}$ is given by the slope of the behavior at the operating point $V_{OP}$.

The frequency at which the thermal response cannot follow the signal may be determined by the thermal resistance and the heat capacity of the HBT and becomes equal to the transition frequency of the gain spectrum of the HBT. Specifically, in a region lower than the transition frequency, the Vb-Ic curve shifts by the self-heating, which resultantly increases the gain, namely, the trans-conductance of the HBT; while, in a region higher than the transition frequency, the Vb-Ic curve becomes invariant independent of the frequency. Thus, the trans-conductance in lower frequencies $gm^{(LF)}$ becomes greater than the trans-conductance in higher frequencies $gm^{(HF)}$.

The transistors, 21, 22, 31, and 32, comprising the first and second differential units, 2 and 3, show the frequency dependent response described above. The equalizer unit 4 effectively cancels or compensates this frequency response of the gain in the first and second differential units, 2 and 3.

Referring back to FIG. 1, the equalizer unit 4, which compensates the frequency response of the paired transistors, 21, 22, 31, and 32, as described above, generates two biases, SB1 and SB2, from the input signals, $V_{IN}$ and /$V_{IN}$. Two biases, SB1 and SB2, are provided to one of the transistors, 22 and 31, in respective differential units, 2 and 3. The equalizer unit 4 includes two resistors, 41 and 42, an operational amplifier 43, two filters, 44 and 45, and two resistors, 48 and 49.

Two input resistors, 41 and 42, which have resistance equal to each other and moderately high enough not to affect the operation of the transistors, 21 and 32, detects an average $V_{INCOM}$ of the input signals, $V_{IN}$ and /$V_{IN}$, and provides this average $V_{INCOM}$ to the non-inverting input of the operational amplifier 43. Specifically, the resistance of two input resistors, 41 and 42, is set greater than 10 kΩ when the current gain β of the transistors, 21 and 32, is around 100, which is typically observed in a transistor for small signal amplification.

As for other two resistors, 48 and 49, these resistors, 48 and 49, detect another average of two biases, SB1 and SB2, each provided to the base of the other two transistors, 22 and 31. The detected average $V_{COM}$ is provided to the inverting input of the operational amplifier 43. The resistance of two resistors, 48 and 49, are equal to each other and is set in a value not affecting the operation of the transistors, 22 and 31. Specifically, assuming the current gain β of the transistors, 22 and 31, are around 100, the resistance of two resistors, 48 and 49, are preferably greater than 10 kΩ.

The output of the operational amplifier 43 is commonly provided to two filters, 44 and 45; and, the outputs of the filters, 44 and 45, are provided to respective bases of the transistors, 22 and 31. Thus, the operational amplifier 43 in the output thereof provides the base current $Ib_2$ through the filter 44 and the other base current $Ib_3$ through the filter 45; accordingly, the output level of operational amplifier 43 is set to be higher than the average $V_{COM}$ by ΔV. The operational amplifier 43 substantially operates as a voltage follower with a voltage gain of unity.

The filters, 44 and 45, each includes a variable resistor, 44a and 45a, and a variable capacitor, 44b and 45b, to constitute a low-pass or high-cut filter with a variable cut-off frequency. Specifically, the cut-off frequency $fc_1$ of the filter 44 is preferably set at the transition frequency of the transistors, 21 and 22; while, the cut-off frequency $fc_2$ of the filter 45 is preferably set at the transition frequency of the transistors, 31 and 32. The resistance, Rpk1 and Rpk2, of the variable resistors, 44a and 45a, and the capacitance, Cpk1 and Cpk2, of the variable capacitors, 44b and 45b, are set such that the cut-off frequency $fc_1$ of the filter 44 determined by the resistor 44a and the capacitor 44b is equal to the transition frequency of two transistors, 21 and 22; while, the resistance Rpk2 of the resistor 45a and the capacitance Cpk2 of the capacitor 45b are set such that the cut-off frequency $fc_2$ of the filter 45, which is determined by a product of the resistance and the capacitance, becomes equal to the transition frequency of two transistors, 31 and 32.

An algorithm to determine the resistance Rpk and the capacitance Cpk will be described in detail. The resistance is determined by an amount of the gain to be decreased in low frequencies. That is, assuming the gain to be decreased is Gr, the current gain of the transistor is β and the trans-conductance in low frequencies is gm, the resistance Rpk may be calculated by an equation of:

$$Rpk=\beta \times (1-Gr)/gm.$$

For instance, when the current gain β is 120, the trans-conductance gm is 0.03 S, and the gain at low frequencies is decreased by half, −3 dB (Gr=½), then the resistance Rpk becomes about 2 kΩ. The capacitance Cpk is determined such that the cut-off frequency fc, which is calculated by fc=1/(2π× Rpk×Cpk), becomes equal to the transition frequency. For instance, the transition frequency of the transistor to be considered is around 2 MHz, then the capacitance Cpk is determined to be about 40 pF.

Figure 4:
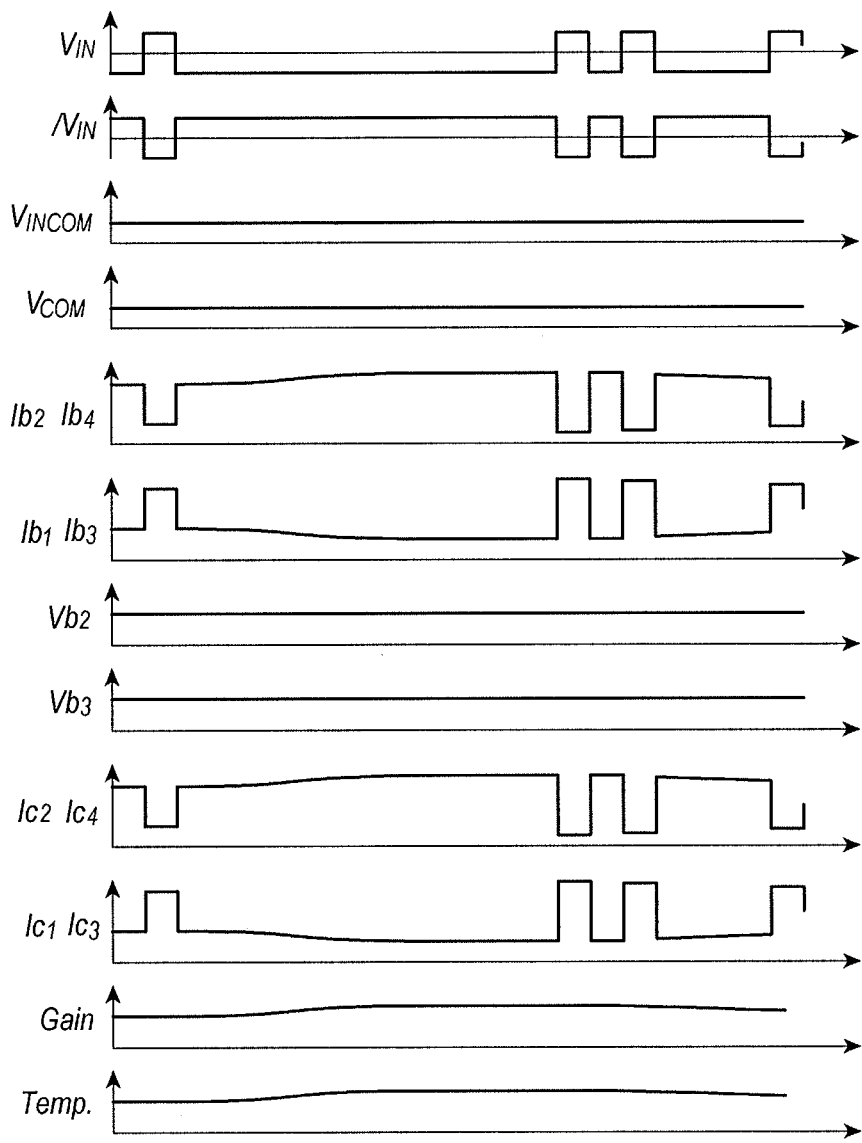
FIG. 4 shows time charts of parameters appeared in the differential circuit of FIG. 1 when no gain compensation operates.
Figure 5:
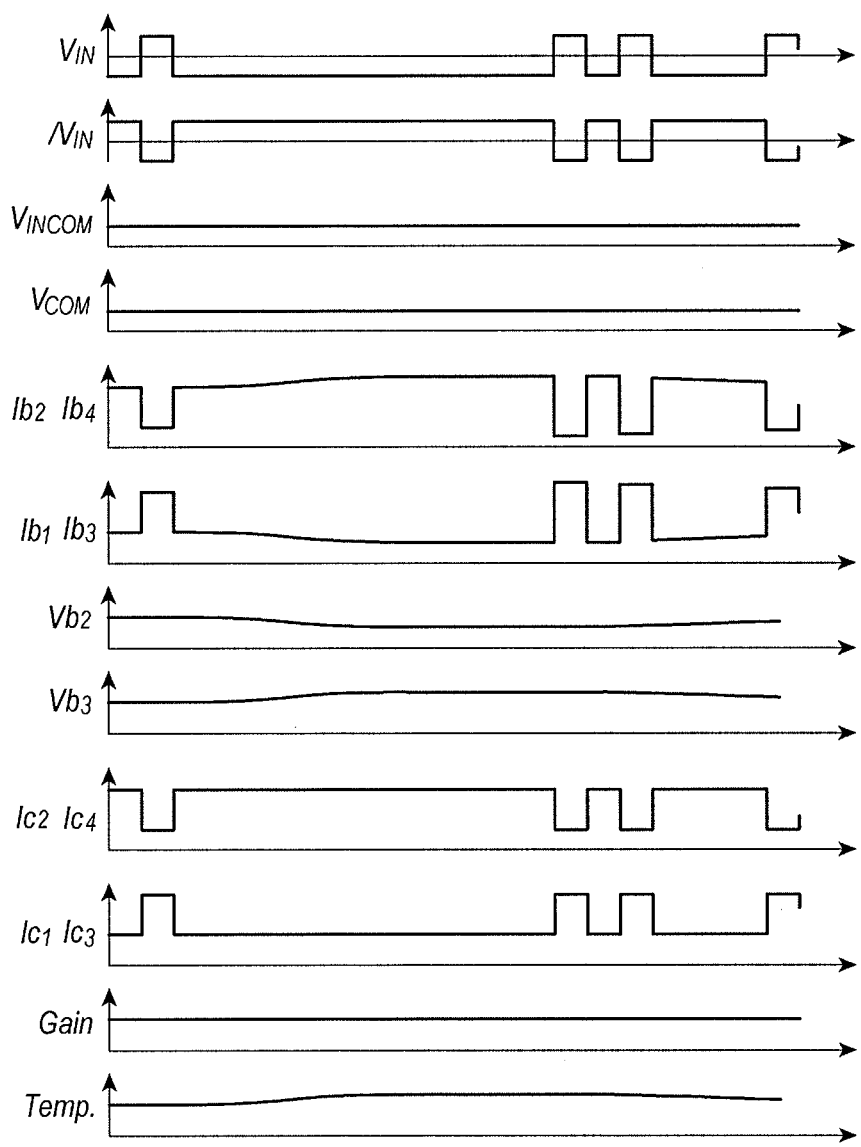
FIG. 5 shows time charts of parameters appeared in the differential circuit of FIG. 1 when the gain compensation by the equalizer unit is effective.

Next, the operating of the differential circuit 1 will be described as referring to FIGS. 1, 4 and 5. FIG. 4 shows time charts of various parameters appeared in the differential circuit 1 under a condition where the resistance Rpk of the filters, 44 and 45, is set to be 0Ω and the output resistance of the operational amplifier 43 is also 0Ω; that is, no compensation for the frequency response of the transistors is caused.

The average $V_{INCOM}$ of two inputs, $V_{IN}$ and $/V_{IN}$, is kept constant. Also, the average $V_{COM}$ of the inputs for the other two transistors, 22 and 31, is also kept constant because the operation amplifier 43 operates so as to make two inputs thereof in virtually short-circuited.

Because the input signal $V_{IN}$ is provided to the base of the first transistor 21, the base current $Ib_1$ varies in phase to the input signal $V_{IN}$. On the other hand, the current source 23 operates to keep the total current flowing in the transistor 21 and the other transistor 22, the other base current $Ib_2$ varies out of phase to the input signal $V_{IN}$, namely, two base currents, $Ib_1$ and $Ib_2$, are complementary to each other.

As for the second differential unit 3, the base current $Ib_4$ varies in phase to the other input $/V_{IN}$, and the second current source 33 operates to set the total current flowing in the third transistor 31 and that in the fourth transistor 32; then, the base current $Ib_3$ of the third transistor 31 varies out of phase to the other input signal $/V_{IN}$, namely, the base current $Ib_3$ of the transistor 31 varies in phase to the input signal $V_{IN}$.

When two filters, 44 and 45, have zero resistance in the variable resistors, 44a and 45a, and the operational amplifier 43 has zero output resistance, which is the ideal condition, the base input $Vb_2$ of the transistor 22 and that $Vb_3$ of the transistor 31 becomes the level same with the input common level $V_{INCOM}$, which means that the base-emitter bias of the transistor 22 varies out of phase to the input signal $V_{IN}$ because the common emitter is connected with two transistors, 21 and 22, varies in phase to the base of the other transistor 21. While, the base-emitter bias of the transistor 31 varies out of phase to the other input signal $/V_{IN}$, namely, in phase to the input signal $V_{IN}$, because the common emitter is connected with two transistors, 31 and 32, varies in phase to the other input $/V_{IN}$. Then the collector current $Ic_2$ of the transistor 22 varies out of phase to the input signal $V_{IN}$, while, the collector current $Ic_3$ of the transistor 31 varies out of phase to the other input $/V_{IN}$.

In frequencies below the transition frequency, the gain of the transistors is affected by the junction temperature, in other words, affected by the collector current thereof. Accordingly, when the input signal $V_{IN}$ continues the low level, or the other input signal $/V_{IN}$ continues the high level, the self-heating effect of the transistor explicitly appears in the frequency response.

When the input signal $V_{IN}$ continues the low level, which means that the transistors, 22 and 32, turn on to flow the collector current therein, the temperature of the transistors 22 and 32, gradually rise, which increases the collector currents, $Ic_2$ and $Ic_4$. When the self-heating of the transistor and the heat dissipation from the transistor compensate, the temperature rise saturates and the collector current become constant. When the status to continue the same level terminates; the temperature of the transistor 22 and that of the transistor 32 gradually approach to the equilibrium temperature, and the collector currents, $Ic_2$ and $Ic_4$, also gradually decrease. When the collector current varies, this variation is directly reflected in the base current thereof. That is, when the collector current $Ic_2$ of the transistor 22 gradually increases, the base current $Ib_2$ thereof also gradually increases because the base-emitter bias is kept constant. The base current $Ib_3$ of the transistor 32 behaves similar to that of the transistor 22.

On the other hand, when the input signal $V_{IN}$ continues the high level, the transistors, 21 and 31, turn on to flow the collector current, $Ic_1$ and $Ic_3$; and the other transistors, 22 and 32, turn off to cut the collector currents, $Ic_2$ and $Ic_4$.

In frequencies less than the transition frequency, the variation of the collector currents, $Ic_1$ to $Ic_4$, compared to the variation of the base bias $Vb_1$ to $Vb_2$, which are the trans-conductance of the transistors, 21 to 32, becomes large. Then, the variation of the collector current, $Ic_1$ to $Ic_2$, becomes larger compared to the variation of the collector current in a region higher than the transition frequency. Thus, the gain enhancement in low frequency occurs.

On the other hand, when the variable resistors, 44a and 45a, of the filters, 44 and 45, have substance resistance; the voltage drop occurs at the variable resistors, 44a and 45a, which varies the base bias SB1 to the transistor 22 and the base bias SB2 to the transistor 31. Specifically, when the input signal $V_{IN}$ continues the low level, the base level of the transistor 22 gradually increases as described above, which makes the base current $Ib_2$ larger and the voltage drop at the variable resistor 44a by the base current greater to lower the base level of the transistor 22. That is, base level of the transistor 22 gradually lowers to decrease the collector current $Ic_2$. Thus, the enhancement of the collector current $Ic_2$, resultantly the gain of the transistor, is effectively cancelled by the voltage drop at the variable resistor, 44a and 45a.

For the transistor 31, the base current thereof gradually decreases when the input signal $V_{IN}$ continues the low level, which results in the decrease of the voltage drop at the variable resistor 45a and rises the base level of the transistor 31 to increase the collector current $Ic_3$ thereof. Then, as shown in FIG. 5, the base level of the transistor $Vb_2$ lowers the level thereof less than the common level $V_{INCOM}$ when the input signal VIN continues the low level. On the other hand, the base level $Vb_3$ of the third transistor 31 increases the level thereof greater than the common level $V_{INCOM}$, which increases the collector current $Ic_3$ of the third transistor 31. In a case, when the input signal $V_{IN}$ continues the high level, the transistor 22 suppresses the gain thereof by the reduction of the base level thereof, or the increase of the voltage drop.

In high frequencies where the capacitors, 44b and 45b, are regarded as the imaginary short-circuited, the variation of the base levels, $Vb_2$ and $Vb_3$, are cut by the variable capacitors, 44b and 45b. That is, the variation of the base currents, $Ib_2$ and $Ib_3$, are not reflected in the voltage drop by the resistors, 44a and 45a. Then, the compensation of the collector current by the variation of the base level due to the voltage drop at the resistors, 44a and 45a, does not occur in such high frequencies.

Thus, the differential circuit 1 effectively compensates only the enhancement of the gain spectrum at low frequencies without reducing the differential gain at high frequencies. The filters, 44 and 45, in particular, the variable resistors, 44a and 45a, cancel the variation of the base currents, $Ib_2$ and $Ib_3$, by the voltage drop caused in the variable resistors, 44a and 45a, by the base currents, $Ib_2$ and $Ib_3$. The variable capacitors, 44b and 45b, effectively cancel the compensation caused by the resistors, 44a and 45a, in high frequencies. Thus, only the enhancement of the differential gain in low frequencies is effectively cancelled without lowering the gain in high frequencies, and without inserting circuit components in the signal line.

Because the filters, 44 and 45, have the variable resistors, 44a and 45a, and the variable capacitors, 44b and 45b; the cut-off frequencies, $fc_1$ and $fc_2$, of the filters, 44 and 45, respectively are optionally adjusted even when the current gain of the transistors, 21 and 22, in the first differential unit 2 is different from the current gain of the transistors, 31 and 32, in the second differential unit 3. The flatness of the differential gain of the differential amplifier 1 is further enhanced.

Figure 6:
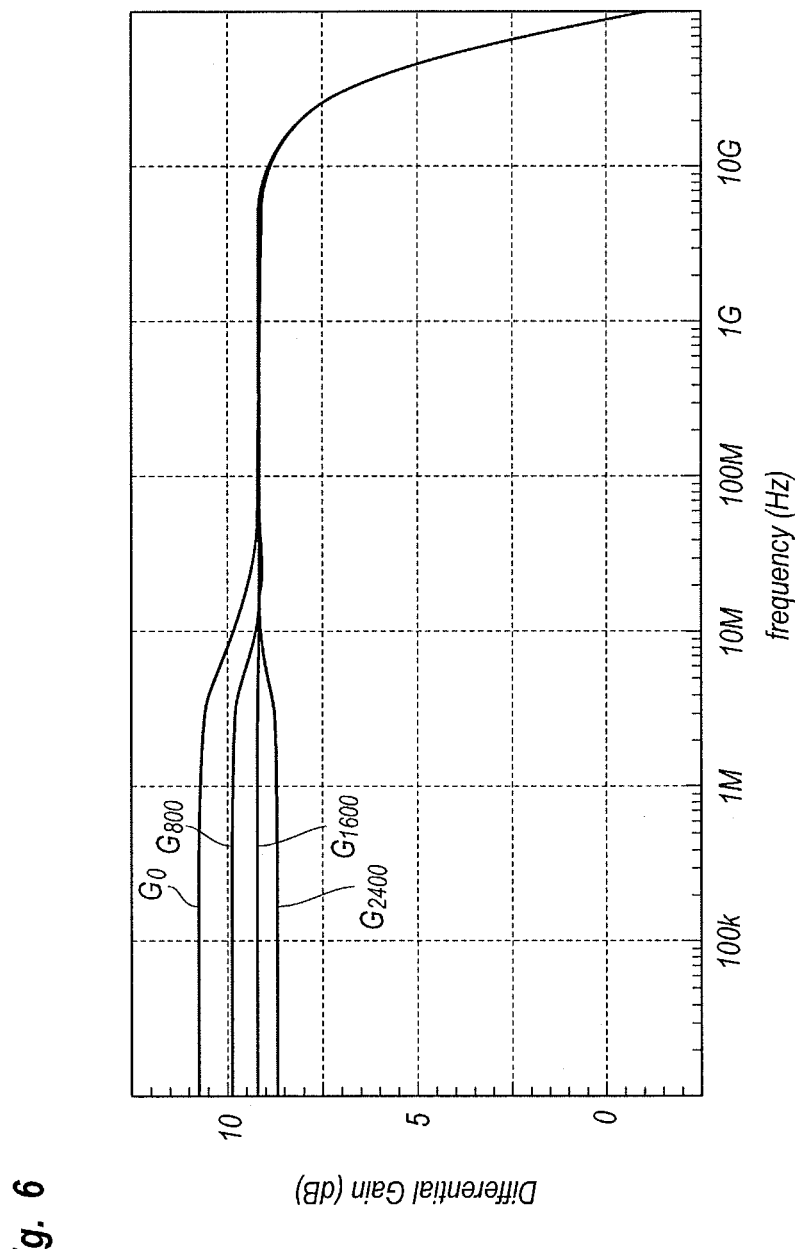
FIG. 6 compares the degree of the gain compensation by varying the resistance of the resistor in the equalizer unit.

FIG. 6 compares the compensation of the differential gain in low frequencies when the resistance $R_{pk}$ of the variable resistor is varied. The behavior G0 corresponds to a condition where the resistance Rpk is 0Ω, and the capacitance Cpk of the variable capacitor is 10 pF; a behavior G800 corresponds to a case of the resistance Rpk of 800Ω and the capacitance Cpk of 10 pF; a behavior G1600 corresponds to a case of the resistance Rpk of 1600Ω and the capacitance Cpk of 10 pF; and a behavior G2400 corresponds to a case where the resistance Rpk is 2400Ω and the capacitance Cpk of 10 pF. Moreover, the behaviors shown in FIG. 6 assumes that the transconductance, $gm_1$ to $gm_4$, of the transistors, 21 to 32, are all equal to 34.4 mS, and the current gains, $β_1$ to $β_4$, thereof are all equal to 274.

As shown in FIG. 6, the gain enhancement in low frequencies is suppressed effectively as the resistance Rpk of the variable resistors, 44a and 45a, becomes greater because of the enhanced voltage drop by the resistors, 44a and 45a. For instance, when the resistance is 0Ω, the gain in low frequencies enhances by about 1.9 dB compared with the gain in high frequencies; the enhancement is about 0.8 dB for the resistance of 800Ω; substantially cancelled for the resistance of 1600 Q; and the reduction of about 0.5 dB occurs for the resistance of 2400Ω, which is the excess compensation.

The enhancement of the differential gain in low frequencies is about 1.9 dB for the zero resistance of the resistor in the filters, 44 and 45. Substituting the value of −1.9 dB in the gain Gr of equation (1) above described, the resistance Rpk becomes 1564Ω, which reflects the practical result that the gain enhancement in low frequencies due to the self-heating of the transistor is effectively compensated by the filter, 44 and 45, when the resistance Rpk of the resistor, 44a and 45a, in the filter, 44 and 45, is set in 1.6 kΩ. Thus, the gain fluctuations of the differential circuit 1 may be effectively suppressed by the filters, 44 and 45.

Thus, setting the cut-off frequency, $fc_1$ and $fc_2$, of the filter, 44 and 45, in the transition frequency at which the Vb-Ic characteristic is modulated by the self-heating of the transistor, 21 to 32; the gain enhancement in low frequencies is effectively suppressed.

Figure 7A:
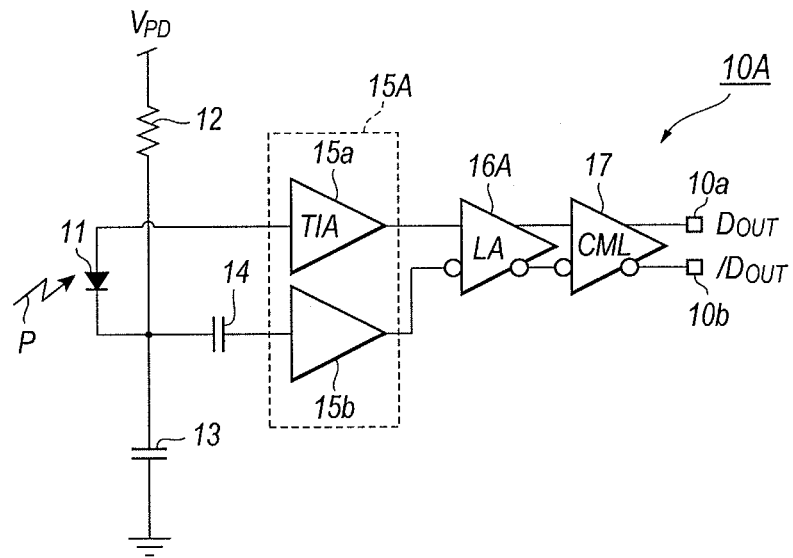
FIG. 7A is a functional block diagram of the optical receiver implemented with the differential circuit of FIG. 1.

Next, some applications of the differential circuit 1 the gain compensating function will be described as referring to FIGS. 7A and 7B. The optical receiver 10A of FIG. 7A includes a photodiode (hereafter denoted as PD) 11, a resister 12, a capacitor 13, a coupling capacitor 14, a pseudo differential TIA 15A, a limiting amplifier (LA) 16A, and a current mode logic (CML) 17. The CML 17 outputs the differential signals, $D_{OUT}$ and $/D_{OUT}$, in respective outputs, 10a and 10b.

The PD 11 converts an optical input P into a photocurrent Ipd to provide this photocurrent Ipd to the TIA 15a in the pseudo differential TIA 15A. That is, the PD 11 is biased by the bias voltage $V_{PD}$ in the cathode thereof via the resistor 12. The resistor 12 and the capacitor 13 constitute a low-pass filter to stabilize the bias supplied to the PD by reducing the high frequency noise. The dummy TIA 15b in the pseudo TIA 15A receives this noise signal through the coupling capacitor 14. The LA 16A receives the output of the TIA 15a and the dummy TIA 15b and differentially amplifies these outputs. Thus, the dummy TIA 15b and the LA 16A effectively suppress the common mode noise because of the differential amplifying by the LA 16A. The CML 17 also differentially amplifies the outputs of the LA 16A and provides amplified signals to the outputs, 10a and 10b, as the output signals, $D_{OUT}$ and $/D_{OUT}$. Because the common mode noise is effectively cancelled by the LA 16A and the arrangement of the TIA 15A with the dummy TIA 15b, the optical receiver 10A is usable as the front end circuit of the optical receiver with the transmission speed exceeding 10 Gbps. The arrangement of the differential circuit shown in FIG. 1 is generally applicable to the LA 16A, and sometimes to the CML 17.

Figure 7B:
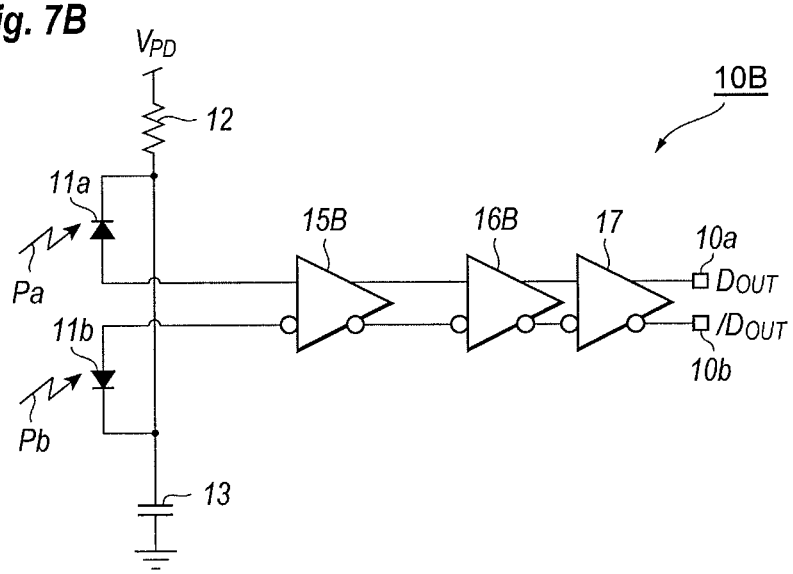
FIG. 7B is another functional block diagram of the optical receiver.

FIG. 7B is a functional block diagram of another optical receiver 10B. The optical receiver 10B provides a pair of PDs, 11a and 11b, each receiving optical signals, Pa and Pb, complementary to each other. Two PDs, 11a and 11b, are commonly biased by the power supply $V_{PD}$, and generate photocurrents, Ipda and Ipdb, also complementary to each other to provide the differential TIA 15B. The differential TIA 15B converts the differential photocurrents, Ipda and Ipdb, into signals differential to each other, and this differential signals are amplified by the differential amplifier 16B and the CML 17. The CML 17 finally outputs the differential signal, $D_{OUT}$ and $/D_{OUT}$, in the outputs, 10a and 10b.

Second Embodiment

Figure 8:
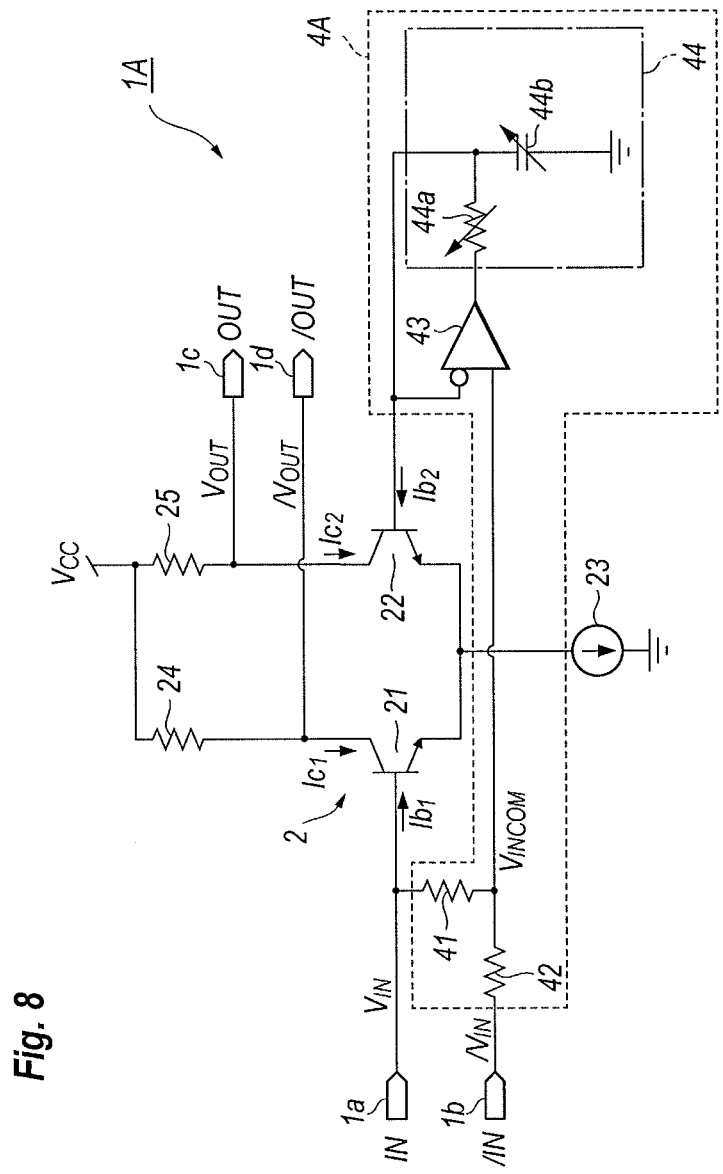
FIG. 8 is a circuit diagram of another differential circuit implemented with the function of the gain compensation.

FIG. 8 shows a circuit diagram of a differential circuit 1A according to another embodiment of the invention. The differential circuit 1A shown in FIG. 8 provides the differential unit 2 and an equalized unit 4A modified from that 4 shown in FIG. 1. Comparing the differential circuit 1A with the original differential circuit shown in FIG. 1, the modified differential circuit 1A omits the second differential unit 3, and a portion of the equalizer unit 4 coupled with the second differential unit 3.

The operation of the differential unit 1A, in particular, the function of the modified equalizer unit 4A is the same as those of the aforementioned equalizer unit 4. That is, when the resistor 44a in the filter 44 is set to be 0Ω, which means that no compensation for the gain enhancement in low frequencies is effective, the modulation of the base level VIN of the transistor 21 is oppositely affected to the base level of the other transistor 22 via the common emitter. Varying the base-emitter bias of transistor 22, the differential gain of the differential unit 2 in low frequencies is raised by the self-heating of the transistor 22.

However, when the variable resistor 44a in the filter 44 has the substance resistance, the fluctuation of the base-emitter bias of the transistor 22 is reduced by the voltage drop caused in the resistor 44a by the base current $Ib_2$, which compensates the differential gain of the differential circuit 2. The degree of the compensation is determined by the resistance of the resistor 44a, while, the frequency, below which the gain enhancement due to the self-heating of the transistor occurs, is determined by the cut-off frequency of the filter 44, that is, the capacitance of the capacitor 44b.

Thus, the differential circuit 1A effectively compensates the gain enhancement in low frequencies due to the self-heating of the transistor without reducing the differential gain in high frequencies.

The differential circuit with the function of the gain compensation according to the present invention is not restricted to those aforementioned embodiments. For instance, the embodiments described above set the cut-off frequencies, $fc_1$ and $fc_2$, of the filters, 44 and 45, in substantially equal to the transition frequency. However, the cut-off frequency may be set in a frequency less than the transition frequency.

Also, the capacitors, 44b and 45b, in the filters, 44 and 45, are grounded. However, these capacitors, 44b and 45b, may be connected to a reference level, or the positive power supply depending on the input voltages, $V_{IN}$ and $/V_{IN}$, that is, whether the input voltages, $V_{IN}$ and $/V_{IN}$, are defined with respect to the ground or the positive power supply. When the transistors, 21 to 32, are formed by the concurrently process, the two differential units, 2 and 3, may share only one filter.

While, particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A differential circuit for receiving input signals complementary to each other and outputting output signals complementary to each other, the differential circuit comprising:
    a first differential unit including a pair of transistors, one of the transistors in the first differential unit receiving one of the input signals, wherein at least an other of the transistors in the first differential unit shows a gain enhancement in frequencies lower than a transition frequency;
    a second differential unit including a pair of transistors, one of the transistors in the second differential unit receiving another of the input signals, wherein at least an other of the transistors in the second transistor unit shows the gain enhancement in frequencies lower than the transition frequency;
    a first filter for providing an average of said input signals to the other of the transistors in the first differential unit by providing a first compensating signal to said other of the transistors in the first differential unit, the first compensating signal being in phase with the one of the input signals; and
    a second lifter for providing the average to the other of the transistors in the second differential unit by providing a second compensating signal to said other of the transistors in the second differential unit, the second compensating signal being in phase with the another of the input signals.

2. The differential circuit of claim 1,
    wherein the first filter and the second filter are a type of a low-pass filter including a resistor and a capacitor, and
    wherein the first compensating signal and the second compensating signal are formed by a voltage drop caused by currents flowing in the resistor of the first filter and the resistor of the second filter, respectively.

3. The differential circuit of claim 2,
    wherein the first filter and the second filter each have a cut-off frequency determined by a product of resistance of the resistor and the capacitance of the capacitor thereof, and
    wherein the cut-off frequency of the first filter and the cut-off frequency of the second filter are substantially equal to the transition frequency.

4. The differential circuit of claim 2,
    wherein the transistors of the first differential unit and the transistors of the second differential unit are a type of bipolar transistor having a base, and
    wherein the currents are bias currents flowing in the base of the other of the transistors in the first differential unit and in the base of the other of the transistors in the second differential unit.

5. The differential circuit of claim 1,
    wherein the first differential unit and the second differential unit have load resistors common to each other.

6. The differential circuit of claim 1,
    wherein the average of the input signals is detected through input resistors each connected to the one of the transistors in the first differential unit and the one of the transistors in the second differential unit.

7. The differential circuit of claim 5,
    further providing an operational amplifier having a non-inverting input, an inverting input and an output, the non-inverting input being connected to input resistors to receive the average of the input signals, the output being connected to the first filter and the second filter,
    wherein the operational amplifier drives the other of the transistors in the first differential unit through the first filter and the other of the transistors in the second differential unit through the second filter.

8. A differential circuit for amplifying input signals to generate output signals, the input signals and the output signals having a configuration of a differential signal, the differential circuit comprising:
    a pair of transistors, one of the transistors receiving one of the input signals, and an other of the transistors receiving an average of the input signals, at least the other of the transistors showing a gain enhancement in frequencies below a transition frequency; and
    a filter having a cut-off frequency, the filter providing the average of the input signals to the another other of the transistors,
    wherein the cut-off frequency is substantially equal to or less than the transition frequency.

9. The differential circuit of claim 8,
    wherein the filter includes a resistor and a capacitor to determine the cut-off frequency by a product of resistance of the resistor and capacitance of the capacitor.

10. The differential circuit of claim 9,
    wherein the filter generates a compensating signal in phase with the one of the input signals.

11. The differential circuit of claim 10,
    wherein the transistors are a type of bipolar transistor, the compensating signal being generated by a voltage drop caused by a base current of the other of the transistors flowing in the resistor of the filter.

12. The differential circuit of claim 9,
    wherein the resistance is determined by:

$$R = \beta \times (1 - Gr)/gm,$$

where R, $\beta$, Gr and gm are the resistance of the resistor, current gain of other of the transistors, the magnitude of the gain enhancement below the transition frequency, and the trans-conductance of the other of the transistors.

13. The differential circuit of claim 9,
wherein the resistor is a variable resistor, and the capacitor is a variable capacitor.

14. The differential circuit of claim 8,
further including an operational amplifier configured with a voltage follower to transmit the average of the input signals to the filter.

15. A differential circuit for amplifying input signals configured with a differential mode, the differential circuit comprising:
a first differential unit for receiving one of the input signals, the first differential unit showing a gain enhancement in frequencies below a transition frequency;
a second differential unit for receiving another of the input signals, the second differential unit showing a gain enhancement in frequencies below the transition frequency; and
an equalizer unit for providing a first compensating signal to the first differential unit and a second compensating signal to the second differential unit by receiving an average of the input signals, the equalizer unit including a first filter and a second filter, the first filter generating the first compensating signal from the average of the input signals, and the second filter generating the second compensating signal from the average of the input signals,
wherein the first compensating signal and the second compensating signal are effective in frequencies below the transition frequency.

16. The differential circuit of claim 15,
wherein the first filter has a cut-off frequency substantially equal to or less than the transition frequency, and the second filter has a cut-off frequency substantially equal to or less than the transition frequency.

17. The differential circuit of claim 15,
wherein the first compensating signal is in phase with the one of the input signals, and the second compensating signal is in phase with the another of the input signals.

* * * * *